United States Patent [19]
Zenke

[11] Patent Number: 6,020,248
[45] Date of Patent: Feb. 1, 2000

[54] METHOD FOR FABRICATING SEMICONDUCTOR DEVICE HAVING CAPACITOR INCREASED IN CAPACITANCE BY USING HEMISPHERICAL GRAINS WITHOUT REDUCTION OF DOPANT CONCENTRATION

[75] Inventor: Masanobu Zenke, Tokyo, Japan

[73] Assignee: NEC Corporation, Tokyo, Japan

[21] Appl. No.: 09/020,856

[22] Filed: Feb. 9, 1998

Related U.S. Application Data

[62] Division of application No. 08/883,314, Jun. 26, 1997.

[51] Int. Cl.$^7$ ........................................... H01L 21/20
[52] U.S. Cl. ...................................................... 438/398
[58] Field of Search ......................... 438/396, 397, 438/398, 393, 395, 386, 381

[56] References Cited

U.S. PATENT DOCUMENTS 5,192,703  3/1993  Lee et al. .
5,563,090  10/1996  Lee et al. .
5,597,760  1/1997  Hirota ..................................... 438/397
5,612,558  3/1997  Harshfield .
5,700,710  12/1997  Zenke ..................................... 438/398

FOREIGN PATENT DOCUMENTS 3-136361  6/1991  Japan .
5-315543  11/1993  Japan .

OTHER PUBLICATIONS

British Search Report dated Sep. 30, 1997.

*Primary Examiner*—Charles Bowers
*Assistant Examiner*—Craig Thompson
*Attorney, Agent, or Firm*—Whitham, Curtis & Whitham

[57] ABSTRACT

A stacked storage capacitor of a dynamic random access memory cell has an accumulating electrode increased in surface area by growing hemispherical silicon grains on an amorphous silicon strip, and a barrier layer of titanium nitride is previously formed between a source region of an associated field effect transistor and the amorphous silicon strip so that phosphorus is hardly diffused from the amorphous silicon strip into the source region.

14 Claims, 11 Drawing Sheets

METHOD FOR FABRICATING SEMICONDUCTOR DEVICE HAVING CAPACITOR INCREASED IN CAPACITANCE BY USING HEMISPHERICAL GRAINS WITHOUT REDUCTION OF DOPANT CONCENTRATION

This is a divisional application of application Ser. No. 08/883,314, filed Jun. 26, 1997.

FIELD OF THE INVENTION

This invention relates to a semiconductor device having a capacitor increased in capacitance and, more particularly, to a structure of the semiconductor device and a process of fabricating the semiconductor device.

DESCRIPTION OF THE RELATED ART

A typical example of the ultra large scale integration is a random access memory device, and the real estate assigned to each memory cell has been reduced. The dynamic random access memory cell stores a data bit in the form of electric charge, and a designer is expected to further decrease the real estate assigned to the storage capacitor without reduction of the capacitance. The manufactures have proposed various kinds of three-dimensional storage capacitor such as a trench storage capacitor and a stacked storage capacitor. The trench storage capacitor is embedded into the semiconductor substrate, and the stacked storage capacitor is fabricated over the semiconductor substrate.

A standard storage capacitor is fabricated as follows. The stacked storage capacitor forms a dynamic random access memory cell together with a switching transistor, and the switching transistor is firstly fabricated on a semiconductor substrate. The switching transistor is covered with a first inter-level insulating layer, and polysilicon is grown over the first inter-level insulating layer. Dopant impurity is introduced into the polysilicon layer, and a photo-resist etching mask is formed on the doped polysilicon layer by using lithographic techniques. Using the photo-resist etching mask, the doped polysilicon layer is patterned into an accumulating electrode through a plasma-assisted dry etching.

Subsequently, a dielectric layer is grown over the accumulating electrode, and is covered with a doped polysilicon layer. The doped polysilicon layer is patterned into a counter electrode as similar to the accumulating electrode.

The switching transistor is overlapped with the prior art standard stacked storage capacitor, and the dynamic random access memory cell occupies a real estate narrower than that of a standard planar dynamic random access memory cell. The capacitance of the stacked storage capacitor is dominated by the surface area of the accumulating electrode opposed to the counter electrode, and the manufacturers have proposed to make the surface of the accumulating electrode rough.

One of the surface roughening technologies is disclosed in Japanese Patent Publication of Unexamined Application No. 5-304273, and is called as HSG (Hemi-sphere-Grain) technology. FIGS. 1A to 1D illustrates the prior art process called as the HSG technology.

A silicon substrate 1a is prepared, and silicon oxide is deposited over the major surface of the silicon substrate 1a. The major surface of the silicon substrate 1a is covered with a silicon oxide layer 1b. A photo-resist etching mask (not shown) is formed on the silicon oxide layer 1b by using lithographic technologies, and the silicon oxide layer 1b is selectively etched away so as to form a contact hole 1c therein as shown in FIG. 1A.

Subsequently, phosphorous-doped amorphous silicon is deposited over the entire surface of the resultant semiconductor structure by using a chemical vapor deposition. The material gases are $Si_2H_6$ and $PH_3$ at 0.1 torr to 2 torr, and the deposition is carried out at 500 degrees to 600 degrees in centigrade. $Si_2H_6$ may be replaced with $SiH_4$. The phosphorous-doped amorphous silicon fills the contact hole 1c, and swells into a phosphorous-doped amorphous silicon layer of 200 nanometers to 500 nanometers thick.

A photo-resist etching mask (not shown) is formed on the phosphorous-doped amorphous silicon layer, and the phosphorous-doped amorphous silicon layer is selectively etched away so as to form an amorphous silicon strip 2a as shown in FIG. 1B.

The resultant semiconductor structure is exposed to silicon-containing gas at $10^{-3}$ torr for 1 to 2 minutes, and is heated to 540 degrees to 650 degrees in centigrade for 1 to 10 minutes after the exposure of the silicon-containing gas. The silicon-containing gas contains $Si_2H_6$, and the $Si_2H_6$ is regulated to 20 sccm to 30 sccm. Hemi-spherical silicon grains are grown on the amorphous silicon strip 2a, and an accumulating electrode 2c is formed on the silicon oxide layer 1b as shown in FIG. 1C.

Subsequently, the accumulating electrode 2c is covered with a dielectric layer 2d, and polysilicon is deposited over the entire surface of the resultant semiconductor structure. Phosphorous is introduced into the polysilicon layer, and the phosphorous doped polysilicon layer is patterned into a counter electrode 2e by using the lithographic techniques and a dry etching. The resultant semiconductor structure is shown in FIG. 1D.

The stacked storage capacitor fabricated through the prior art process encounters a problem in that the hemi-spherical silicon grains do not increase the capacitance as expected.

SUMMARY OF THE INVENTION

It is therefore an important object of the present invention to provide a process through which a storage capacitor widely increases the capacitance.

The present inventor contemplated the problem inherent in the stacked storage capacitor fabricated through the prior art process, and found that the hemi-spherical silicon grains contained a negligible amount of phosphorous. The present inventor investigated the cause of the shortage of phosphorous, and found the following facts. First, the phosphorous was freely diffused in the amorphous silicon during the heat treatment for the growth of the semi-spherical silicon grains, and the surface portion of the accumulating electrode 2a contained a negligible amount of phosphorous upon completion of the growth of the hemi-spherical silicon grains 2b. The phosphorous was hardly diffused into the hemi-spherical silicon grains 2b after the growth of the hemi-spherical silicon grains 2b, because the hemi-spherical silicon grains were constricted at the boundaries to the amorphous silicon strip 2a.

The hemi-spherical silicon grains 2b thus containing a negligible amount of phosphorous allowed a depletion layer to widely extended from the boundary of the dielectric layer 2d, and the wide depletion layer decreased the capacitance of the stacked storage capacitor.

The present inventor firstly increased the phosphorous concentration of the amorphous silicon strip 2a before the growth of the hemi-spherical silicon grains. When the phosphorous concentration was equal to or grater than $10^{20}$ atom/cm$^3$, the large amount of phosphorous prevented the stacked storage capacitor from reduction of the capacitance. However, the large amount of phosphorous were diffused into the semiconductor substrate 1a during a heat treatment after the growth of hemi-spherical silicon grains, and deteriorated the switching transistor. The effective phosphorous concentration effective against the reduction of the capacitance without deterioration of the switching transistor was so narrow that the increase of the phosphorous concentration was not practical.

The present inventor noticed that a barrier layer would prevented the switching transistor from the phosphorous diffused from the accumulating electrode.

To accomplish the object, the present invention proposes to insert a barrier layer between an accumulating electrode of an impurity region formed in a semiconductor substrate.

In accordance with one aspect of the present invention, there is provided a semiconductor device fabricated on a semiconductor substrate having a contact area, comprising; a capacitor including an accumulating electrode formed of conductive material doped with a dopant impurity and having a boss portion electrically connected to the contact area and a rough surface portion merged with the boss portion, a dielectric film structure covering at least the rough surface portion, and a counter electrode held in contact with the dielectric film structure and opposed to the rough surface portion; and a conductive barrier layer formed between the contact area and the boss portion and blocking the contact area from the dopant impurity diffused from the accumulating electrode.

In accordance with another aspect of the present invention, there is provided a process of fabricating a capacitor on a semiconductor substrate, comprising the steps of: a) preparing a semiconductor substrate having a contact area; b) forming a barrier layer covering the contact area and formed of a conductive material blocking the contact area from a dopant impurity; c) forming a boss portion of an accumulating electrode formed of semiconductor material doped with the dopant impurity and held in contact with the barrier layer; d) growing a rough surface portion of the accumulating electrode on the boss portion by using a high-temperature growing technique; e) covering the rough surface portion with a dielectric layer; and f) forming a counter electrode on the dielectric layer.

BRIEF DESCRIPTION OF THE DRAWINGS

The features and advantages of the process according to the present invention will be more clearly understood from the following description taken in conjunction with the accompanying drawings in which.

DESCRIPTION OF THE PREFERRED EMBODIMENTS

First Embodiment

Figure 1A:
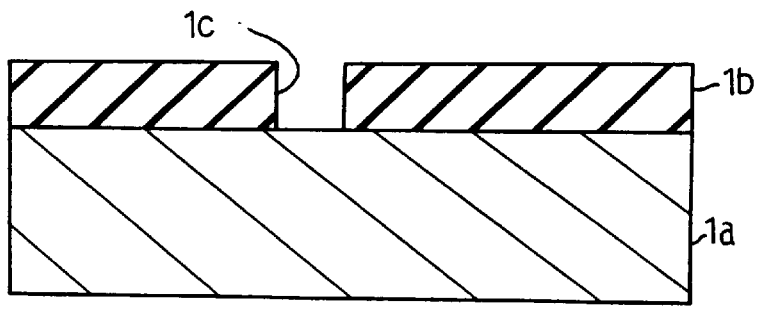
FIGS. 1A to 1D are cross sectional views showing the process disclosed in Japanese Patent Publication of Unexamined Application No. 5-304273.
Figure 1B:
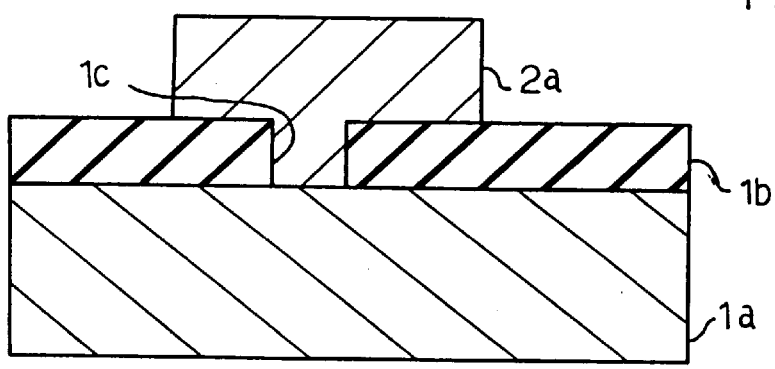
Figure 1C:
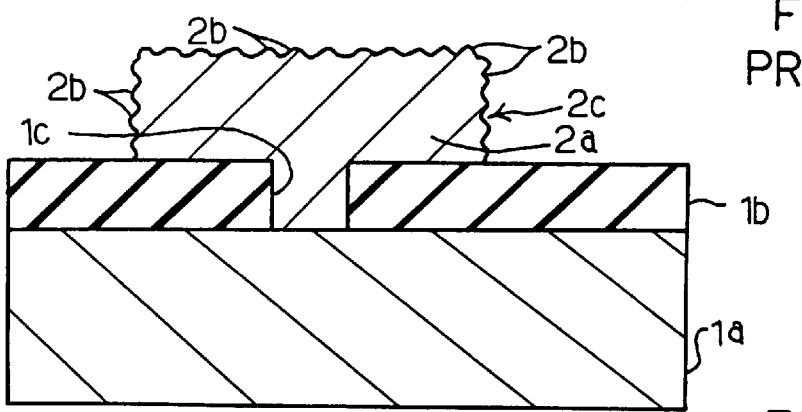
Figure 1D:
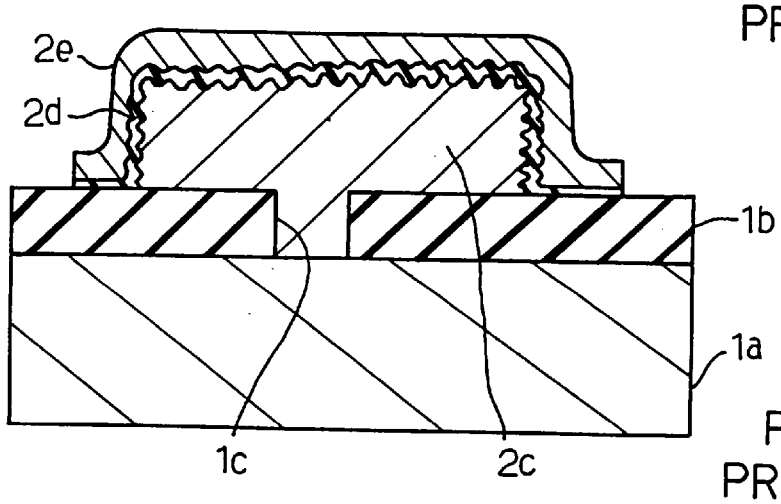

FIGS. 2A to 2H illustrate a process of fabricating a dynamic random access memory cell embodying the present invention. The process starts with preparation of a p-type silicon substrate 10. Though not shown in the drawings, a thick field oxide layer is selectively grown on the major surface of the p-type silicon substrate 10, and defines an active area assigned to a pair of dynamic random access memory cells. Description is hereinbelow focused on one of the dynamic random access memory cells.

A thin gate oxide layer 11a is grown on the active area, and polysilicon is deposited over the thick field oxide layer and the thin gate oxide layer 11a. Thus, a polysilicon layer is laminated on the thin gate oxide layer 11a.

Photo-resist solution is spun onto the polysilicon layer, and is baked so as to form a photo-resist layer on the polysilicon layer. A pattern image is transferred from a photo-mask (not shown) to the photo-resist layer, and a latent image is formed in the photo-resist layer. The latent image is developed, and a photo-resist etching mask is formed on the polysilicon layer. Using the photo-resist etching mask, the polysilicon layer is selectively etched away so as to form a gate electrode 11b on the thin gate oxide layer 11a. Thus, the polysilicon layer is patterned into the gate electrode by using lithographic techniques followed by the etching.

N-type dopant impurity is ion implanted into the active area without a photo-resist ion-implantation mask, and heavily doped n-type source/drain regions 11c/11d are formed in the active area in a self-aligned manner with the gate electrode 11b. The thin gate oxide layer 11a, the gate electrode 11b and the heavily doped n-type source/drain regions 11c/11d as a whole constitute an n-channel enhancement type switching transistor 11.

Figure 2A:
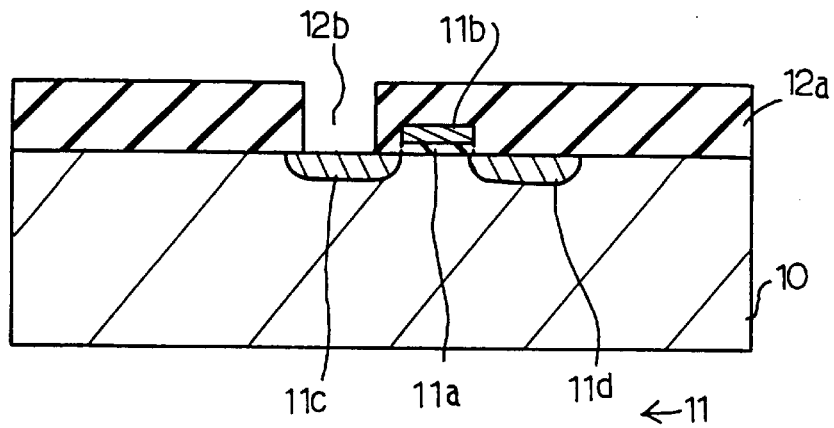
FIGS. 2A to 2H are cross sectional views showing a process of fabricating a dynamic random access memory cell according to the present invention.

Subsequently, silicon oxide is deposited over the entire surface of the resultant semiconductor structure, and the n-channel enhancement type switching transistor 11 is covered with a silicon oxide layer 12a. A photo-resist etching mask (not shown) is formed on the silicon oxide layer 12a by using the lithographic techniques, and the silicon oxide layer 12a is selectively etched away so as to form a node contact hole 12b by using a dry etching. The heavily doped n-type source region 11c is exposed to the node contact hole 12b as shown in FIG. 2A.

Figure 2B:
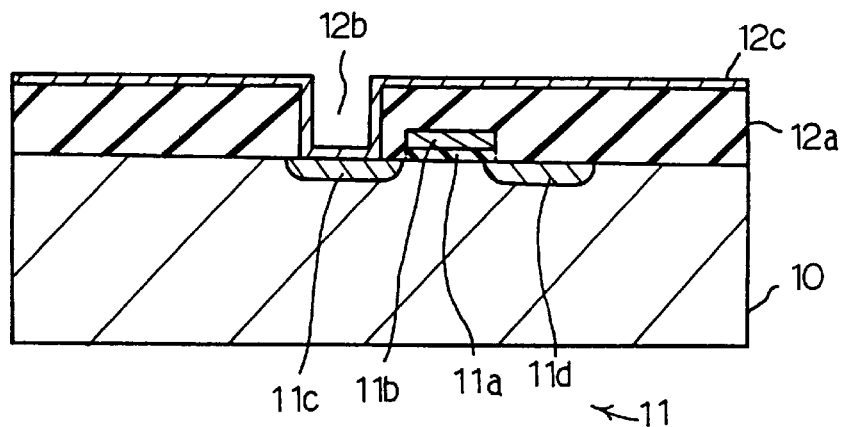

Titanium is deposited to 5 nanometers to 50 nanometers thick over the entire surface of the resultant semiconductor structure by using a sputtering or a chemical vapor deposition, and a titanium layer 12c topographically extends along the silicon oxide layer 12a and the heavily doped n-type source region 11c as shown in FIG. 2B.

Figure 2C:
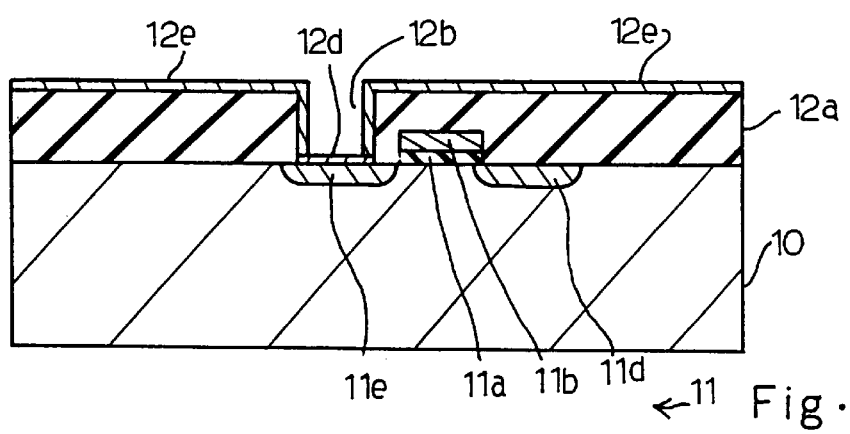

The resultant semiconductor structure is placed in nitriding ambience. Nitrogen, ammonia or gaseous mixture thereof creates the nitriding ambience, and the resultant semiconductor structure is heated to 500 degrees to 700 degrees in centigrade. The titanium on the source region 11c reacts with silicon, and the titanium and the silicon produces a titanium silicide layer 12d. On the other hand, the titanium on the silicon oxide layer 12a is nitrided, and the silicon oxide layer 12a is covered with titanium nitride layers 12e as shown in FIG. 2C.

Figure 2D:
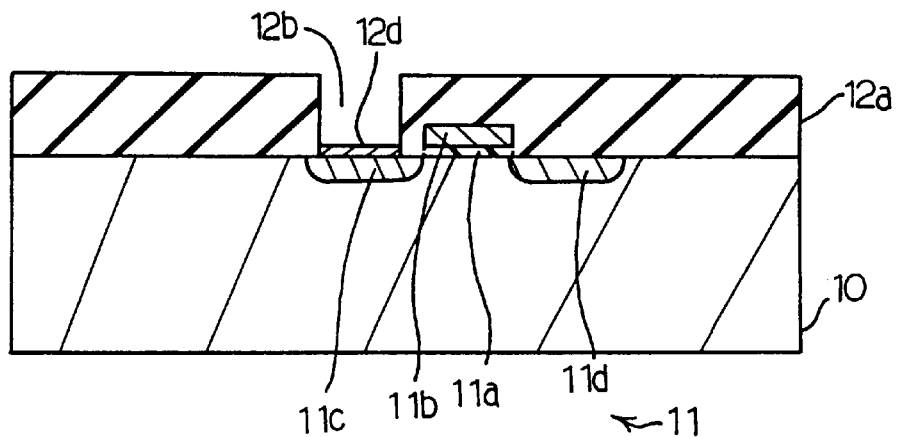

Subsequently, the resultant semiconductor structure is dipped into etching solution containing ammonia and hydrogen peroxide at room temperature to 100 degrees in centigrade, and the titanium nitride layers 12e are selectively etched away as shown in FIG. 2D. The titanium nitride layers 12e may be selectively removed by using etching solution containing sulfuric acid and hydrogen peroxide at 60 degrees to 100 degrees in centigrade. Upon completion of the wet etching, the titanium silicide layer 12d is left on the heavily doped n-type source region 11c.

Figure 2E:
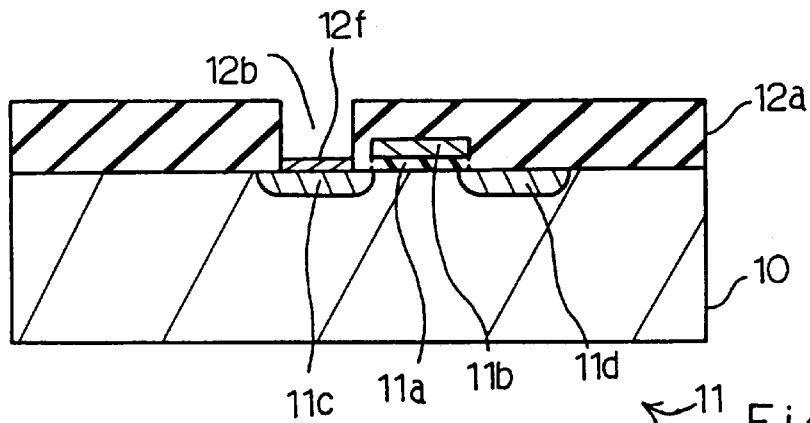

The resultant semiconductor structure is placed in the nitriding ambience at 700 degrees to 1000 degrees in centigrade. Nitrogen, ammonia and gaseous mixture thereof creates the nitriding ambience. The titanium silicide reacts with the nitriding gas, and is converted to silicon-containing titanium nitride. The titanium silicide layer 12d is converted to a silicon-containing titanium nitride layer 12f as shown in FIG. 2E, or the titanium silicide layer 12d is covered with a silicon-containing titanium nitride layer.

Subsequently, phosphorous-doped amorphous silicon is deposited to 200 nanometers to 500 nanometers thick over the entire surface of the resultant semiconductor structure by using a chemical vapor deposition. Gaseous mixture containing $Si_2H_6$ and $PH_3$ or gaseous mixture containing $SiH_4$ and $PH_3$ is used in the chemical vapor deposition, and is regulated to 0.1 torr to 2 torr. The chemical vapor deposition is carried out at 500 degrees to 600 degrees in centigrade, and the amorphous silicon contains the phosphorous at $1\times10^{20}$ atom/cm$^3$ to $5\times10^{20}$ atom/cm$^3$.

Figure 2F:
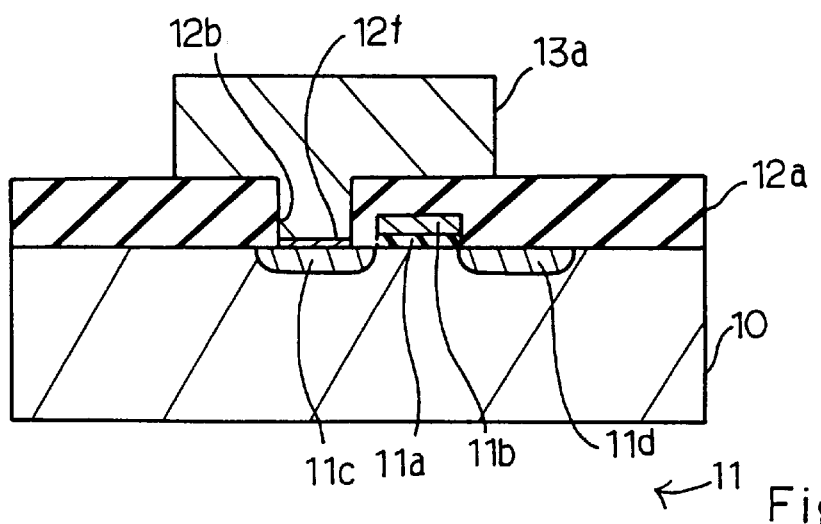

A photo-resist etching mask (not shown) is provided on the phosphorous-doped amorphous silicon layer by using the lithographic techniques and the dry etching, and the phosphorous-doped amorphous silicon layer is patterned into an amorphous silicon strip 13a as shown in FIG. 2F.

Figure 2G:
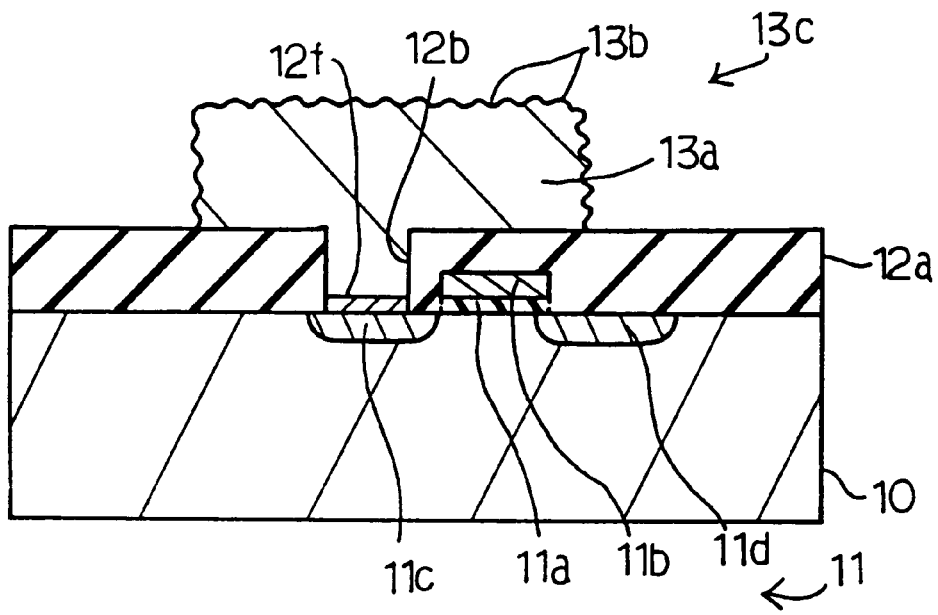

Subsequently, hemi-spherical silicon grains are grown on the surface of the amorphous silicon strip 13a. For example, $Si_2H_6$ gas is introduced into a reactor of a chemical vapor deposition system at $10^{-3}$ torr or less, and the flow rate of $Si_2H_6$ gas ranges from 20 sccm to 30 sccm. The resultant semiconductor structure is 540 degrees to 650 degrees in centigrade, and $Si_2H_6$ gas is continuously supplied for 1 to 2 minutes. Thereafter, $Si_2H_6$ gas is stopped, and the resultant semiconductor structure is continuously heated for 1 minute to 10 minutes. Then, the hemi-spherical silicon grains 13b are grown on the surface of the amorphous silicon strip 13a as shown in FIG. 2G. The hemi-spherical silicon grains 13b increase the surface area of an accumulating electrode 13c twice as wide as amorphous silicon strip 13a.

Silicon nitride is deposited to 5 nanometers to 10 nanometers thick over the entire surface of the resultant semiconductor structure by using a low-pressure chemical vapor deposition, and gaseous mixture containing $SiH_2Cl_2$ and $NH_3$ is used in the low-pressure chemical vapor deposition. The accumulating electrode 13c is covered with a silicon nitride layer.

The resultant semiconductor structure is placed in a high-temperature oxidizing ambience, and a surface portion of the silicon nitride layer is oxidized so as to cover the accumulating electrode 13c with a composite dielectric film structure 13d.

Figure 2H:
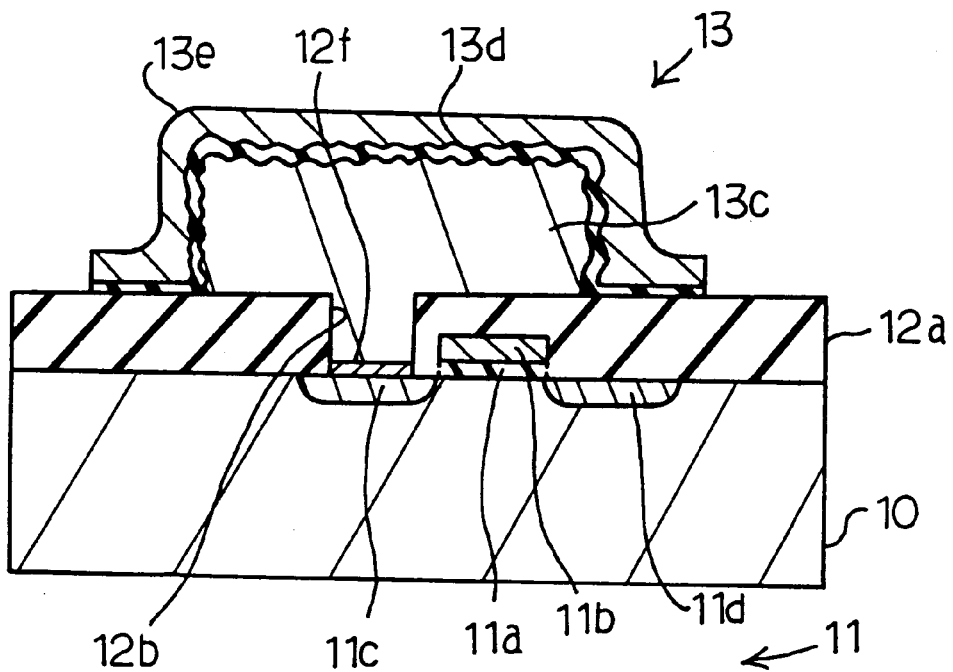

Subsequently, polysilicon is deposited to 100 nanometers to 300 nanometers thick over the composite dielectric film structure 13d by using a low-pressure chemical vapor deposition, and a polysilicon layer is laminated on the composite dielectric film structure 13d. Phosphorous is introduced into the polysilicon layer by using a thermal diffusion or an ion-implantation. A photo-resist etching mask is provided on the phosphorous-doped polysilicon layer by using the lithographic techniques, and the phosphorous-doped polysilicon layer is patterned into a counter electrode 13e by using a dry etching. As a result, a storage capacitor 13 is fabricated on the silicon oxide layer 12a as shown in FIG. 2H.

After the deposition of the amorphous silicon, the amorphous silicon strip 13a is heavily doped with the phosphorous, and the phosphorous is never diffused into the p-type silicon substrate 10 during the repetition of heat treatment, because the silicon-containing titanium nitride layer 12f does not allow the phosphorous to pass therethrough. As a result, the accumulating electrode 13c maintains the high phosphorous concentration, and the stacked storage capacitor 13 is not reduced in capacitance.

The present inventor evaluated the stacked storage capacitor 13 as follows. The present inventor fabricated samples of a parasitic transistor shown in FIG. 3. A thick field oxide layer 20a was grown on a silicon substrate 21, and impurity regions 20b/20c were formed in the silicon substrate 21 on both sides of the thick field oxide layer 20a. A titanium nitride layer 20d was formed on the impurity region 20c, and a phosphorous-doped polysilicon strip 20e was stacked on the titanium nitride layer 20c. The samples were different in the distance D between the impurity regions, and were heated to 900 degrees in centigrade for 30 minutes. The present inventor investigated relation between the threshold Vth of the parasitic transistor and the distance D. The present inventor measured the threshold Vth, and plotted the threshold Vth in terms of the distance D. Plots PL1 represented the relation between the threshold Vth and the distance D for the samples.

Figure 3:
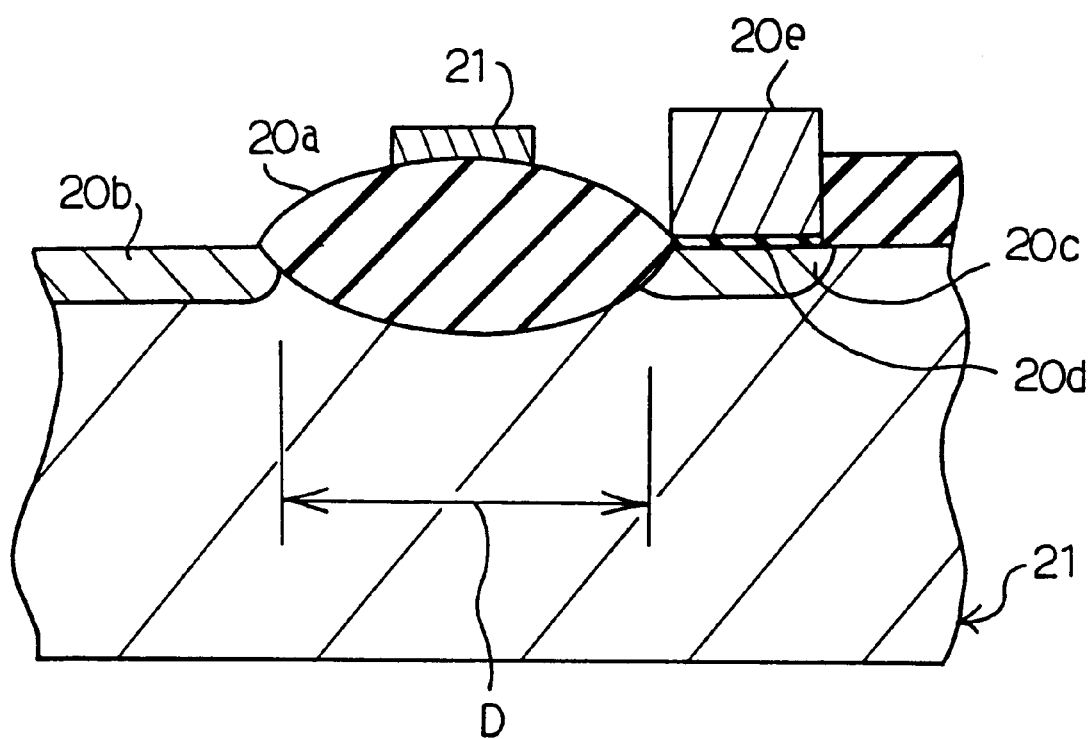
FIG. 3 is a cross sectional view showing a parasitic transistor used for an evaluation of the stacked storage capacitor of the dynamic random access memory cell.
Figure 4:
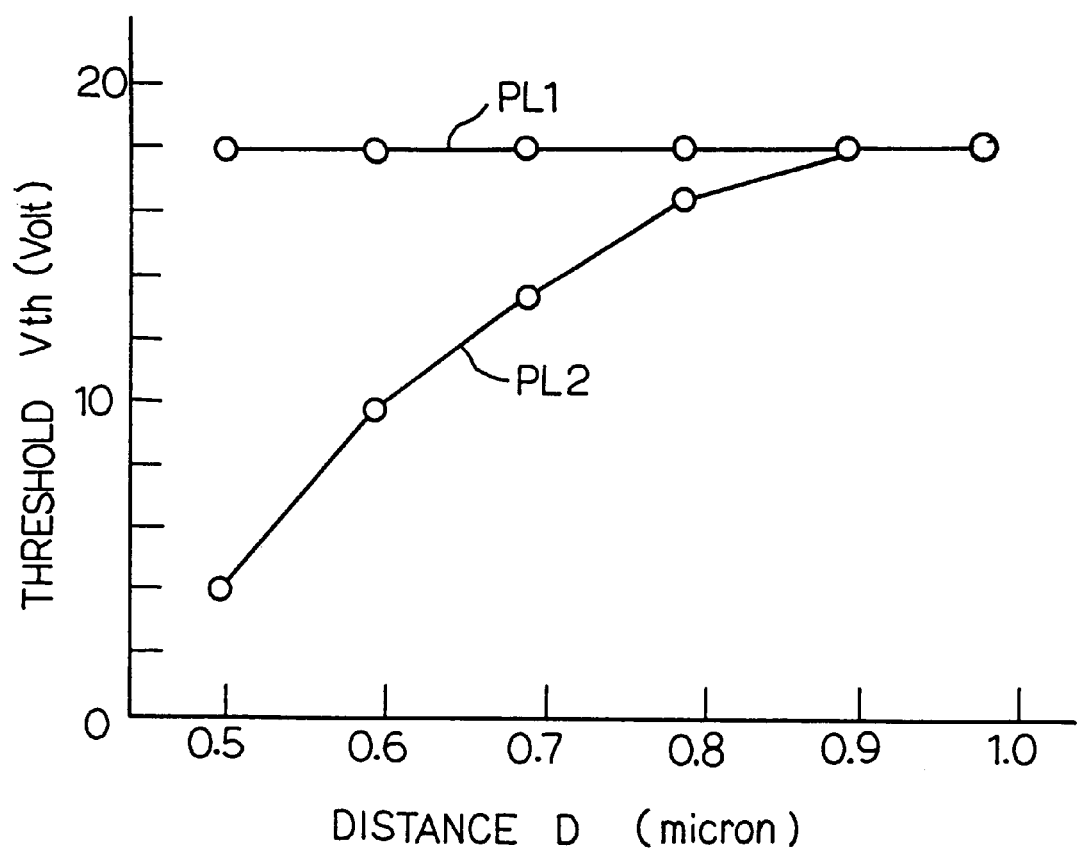
FIG. 4 is a graph showing the relation between a threshold and a distance between impurity regions for investigation of influences of diffused phosphorous.
Figure 5:
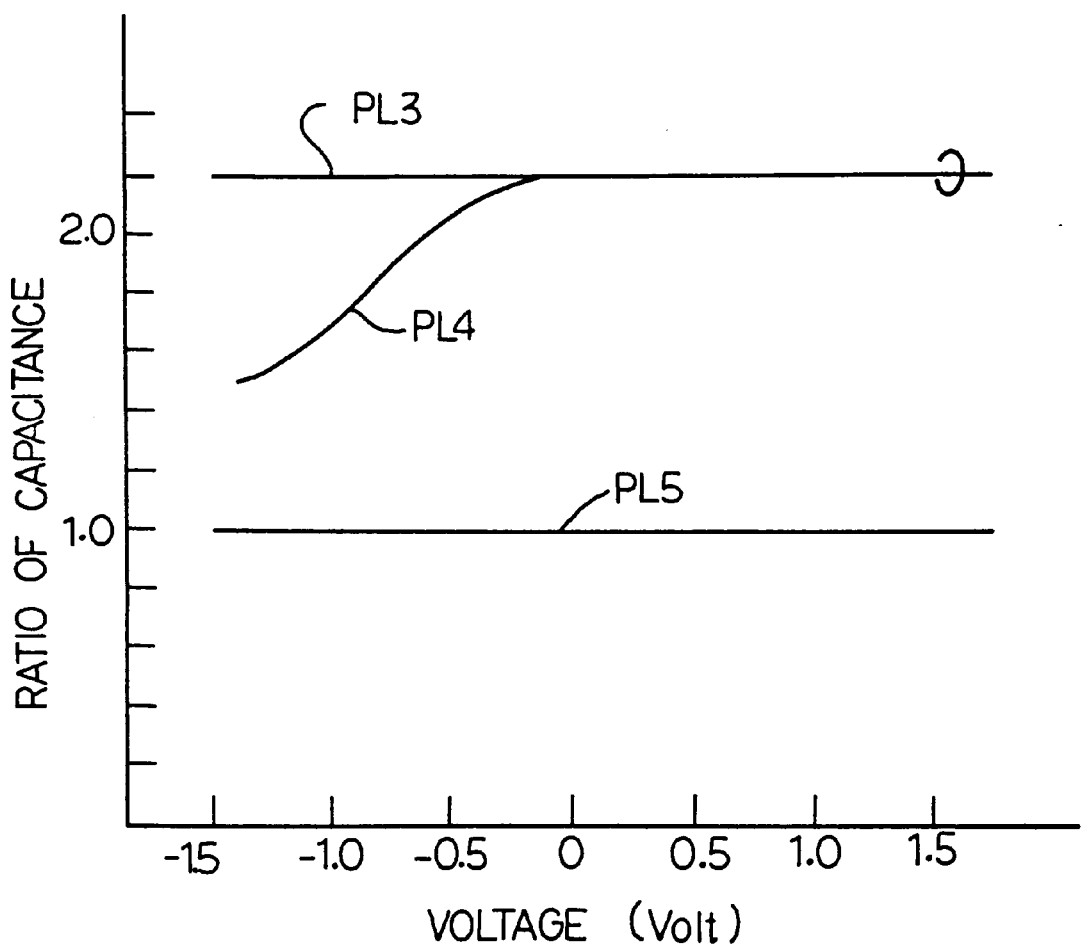
FIG. 5 is a graph showing capacitance-to-voltage characteristics of samples fabricated for an evaluation of a barrier layer.

The present inventor further fabricated comparative samples of a parasitic transistor which was similar to the parasitic transistor shown in FIG. 3 except for the titanium nitride layer 20d. The comparative samples were also different in the distance D, and were heated to 900 degrees in centigrade for 30 minutes. The present inventor measured the threshold Vth of the comparative samples, and the threshold Vth was plotted in terms of the distance D. Plots PL2 represented the relation between the threshold Vth and the distance D for the comparative samples.

As will be understood from plots PL1 and PL2, although the comparative samples decreased the threshold Vth together with the distance D from 0.9 micron, the samples shown in FIG. 3 maintained the threshold Vth until the distance D of 0.5 micron. This was because of the fact that the titanium nitride layer 20d presented the silicon substrate from undesirable influences of the phosphorous diffused from the phosphorous-doped polysilicon strip 20e.

The present inventor further evaluated the stacked storage capacitor through the capacitance-to-voltage characteristics. The present inventor prepared three kinds of samples. The hemi-spherical silicon grains were grown on the accumulating electrodes of the first and second samples, and the third sample did not have a hemi-spherical silicon grain. The first sample had the titanium nitride layer 12f between the accumulating electrode 13c and the heavily doped n-type source region 11c, and the titanium nitride layer 12f was deleted from the second sample.

Plots PL3, PL4 and PL5 represented the capacitance-to-voltage characteristics of the first sample, the capacitance-to-voltage characteristics of the second sample and the capacitance-to-voltage characteristics of the third sample, respectively. The first sample achieved the constant capacitance twice as large as the capacitance of the third sample. Although the capacitance of the second sample was as large as that of the first sample at positive potentials, the capacitance was decreased at the negative potentials due to the depletion layers at the boundary between the accumulating electrode and the composite dielectric film structure. The present inventor measured the phosphorous concentration of the first, second and third samples. The first sample was doped at $1 \times 10^{20}$ atom/cm$^3$, the second sample was doped at $7 \times 10^{19}$/cm$^3$, and the third sample was doped at $7 \times 10^{19}$/cm$^3$. Thus, the present inventor confirmed that the titanium nitride layer 12f was surely effective against the undesirable diffusion from the accumulating electrode 13c.

Second Embodiment

Figure 6A:
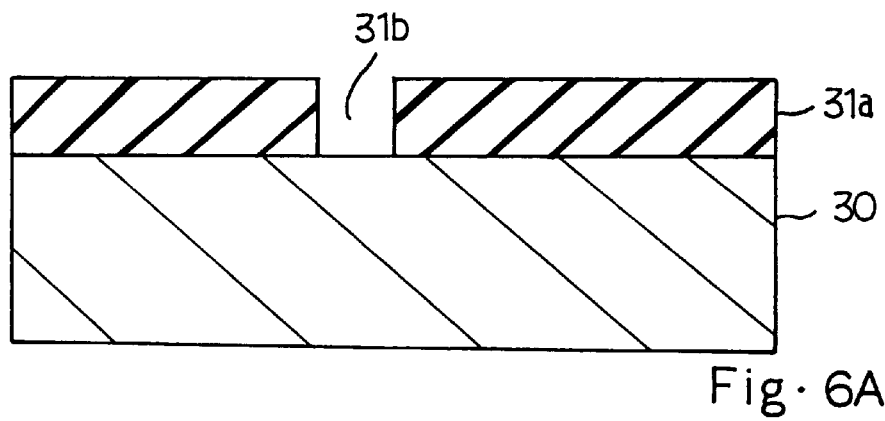
FIGS. 6A to 6D are cross sectional views showing a process of fabricating a stacked storage capacitor according to the present invention.

FIGS. 6A to 6D illustrate another process embodying the present invention. A silicon substrate 30 is prepared, and a silicon oxide layer 31a is laminated on the major surface of the silicon substrate 30. A photo-resist etching mask (not shown) is prepared on the silicon oxide layer 31a by using the lithographic techniques, and the silicon oxide layer 31a is partially etched away so as to form a contact hole 31b as shown in FIG. 6A.

Figure 6B:
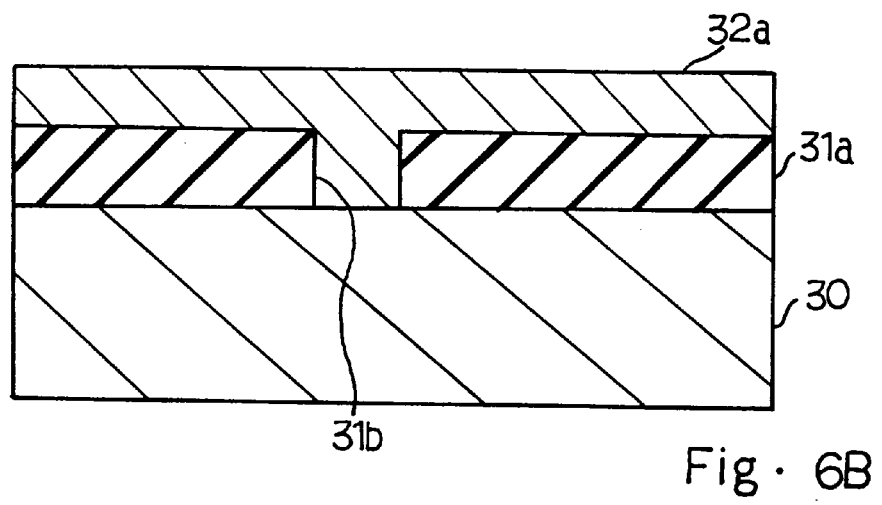

Titanium nitride (TiN) is deposited over the entire surface of the resultant semiconductor structure by using a chemical vapor deposition. The titanium nitride fills the contact hole 31b, and swells into a titanium nitride layer 32a of 100 nanometers to 600 nanometers thick as shown in FIG. 6B. Tetrakis-dimethylamino-titanium (Ti{N(CH$_3$)$_2$}$_4$) or tetrakis-diethylamino-titanium (Ti{N(C$_2$H$_5$)$_2$}$_4$ may be pyrolyzed at 400 degrees to 500 degrees in centigrade. Alternatively, gaseous mixture containing TiCl$_4$ and NH$_3$ may be introduced into a diode parallel plates plasma chemical vapor deposition system so as to produce the titanium nitride at 500 degrees to 700 degrees in centigrade.

Figure 6C:
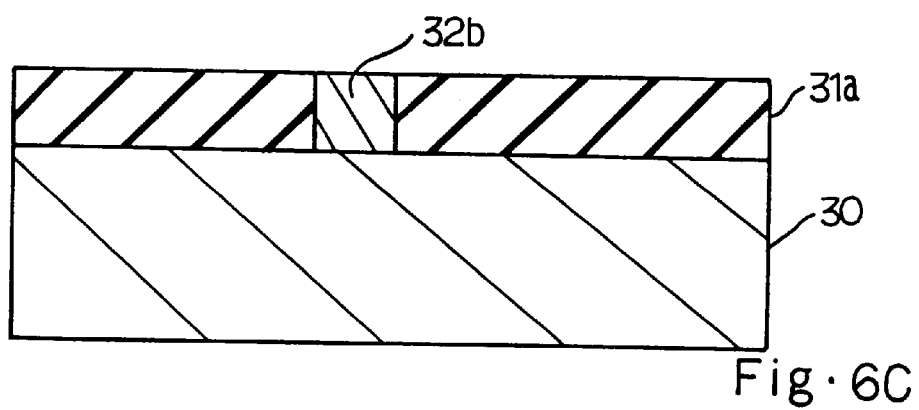

Subsequently, the titanium nitride layer 32a is uniformly etched away without an etching mask by using SF$_6$ gaseous etchant. A titanium nitride plug 32b is left in the contact hole 31b as shown in FIG. 6C. The titanium nitride plug 32b may be annealed in ammonia ambience at 600 degrees to 900 degrees in centigrade so as to make the titanium nitride dense.

As similar to the first embodiment, phosphorous-doped amorphous silicon is grown to 200 nanometers to 500 nanometers thick on the entire surface of the resultant semiconductor structure by using the low-pressure chemical vapor deposition. The phosphorous-doped amorphous silicon layer is patterned into a phosphorus-doped amorphous silicon strip 33a by using the lithographic techniques and the dry etching. Hemi-spherical silicon grains 33b are grown on the phosphorous-doped amorphous silicon strip 33a, and an accumulating electrode 33c is produced from the hemispherical silicon grains 33b and the phosphorous-doped amorphous silicon strip 33a. The hemi-spherical silicon grains are grown as follows. Si$_2$H$_6$ gas is supplied to the reactor at 540 degrees to 650 degrees in centigrade at $10^{-3}$ torr or less for 1 minute to 2 minutes, and the flow rate of Si$_2$H$_6$ gas is regulated to 20 sccm to 30 sccm. Thereafter, the resultant semiconductor structure is maintained in the high-temperature ambience for 1 minute to 10 minutes. The accumulating electrode 33c is twice as wide in the surface area as a standard accumulating electrode without the hemispherical silicon grains.

Subsequently, SiH$_2$Cl$_2$ gas and NH$_3$ gas are introduced into a reactor of a low-pressure chemical vapor deposition system, and silicon nitride is deposited to 5 nanometers to 10 nanometers thick. The accumulating electrode 33c is topographically covered with a silicon nitride layer, and a surface portion of the silicon nitride layer is oxidized so as to laminate a silicon oxide layer. The remaining silicon nitride layer and the silicon oxide layer form in combination a composite dielectric film.

Figure 6D:
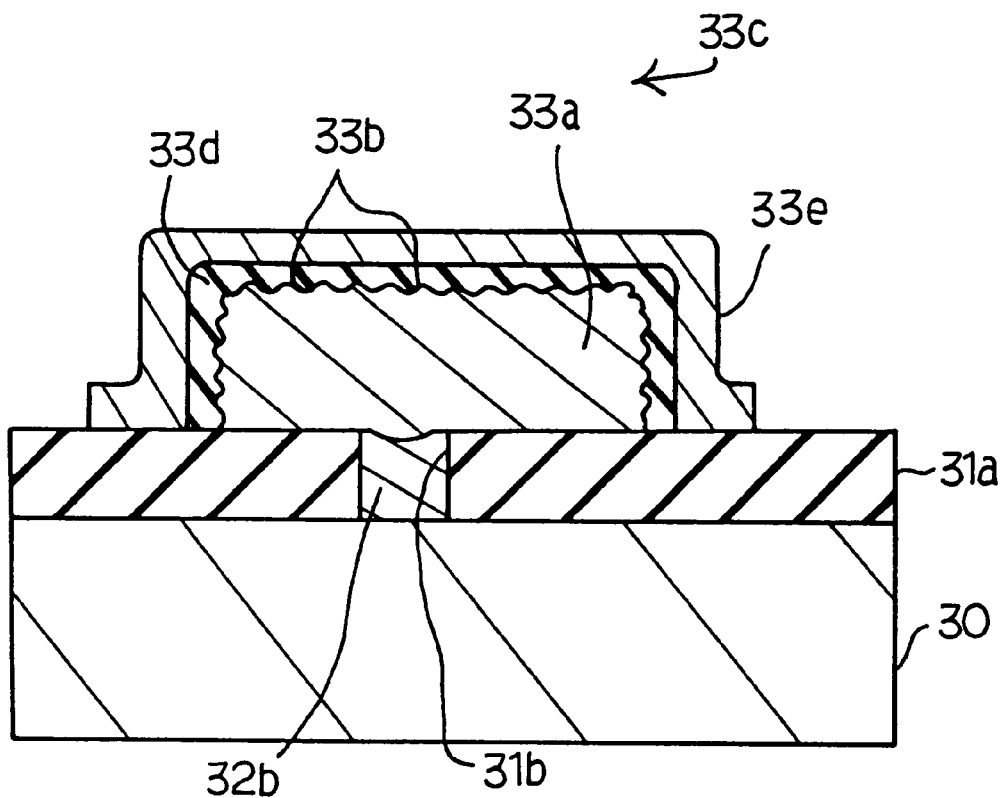

Polysilicon is deposited to 100 nanometers to 300 nanometers thick over the entire surface of the composite dielectric film by using a low-pressure chemical vapor deposition, and phosphorous id introduced into the polysilicon layer by using an ion-implantation or a thermal diffusion. Finally, the phosphorous-doped polysilicon layer and the composite dielectric film are patterned into a dielectric layer 33d and a counter electrode 33e by using the lithographic techniques and the dry etching. The resultant semiconductor structure is shown in FIG. 6D.

The titanium nitride plug 31b does not allow the phosphorous to be diffused from the accumulating electrode 33a into the silicon substrate 30, and the phosphorous concentration of the accumulating electrode 33a is equal to or greater than $10^{20}$ atom/cm$^3$ after the formation of the counter electrode 33e. As a result, the undesirable depletion layer never widely extends under the reverse biasing condition, and the stacked storage capacitor maintains the capacitance. Moreover, the contact hole 31b is plugged with the piece 32b of titanium nitride concurrently with the formation of the barrier layer, and the process sequence is made simple.

Third Embodiment

FIGS. 7A to 7D illustrates yet another process of fabricating a dynamic random access memory cell having a stacked storage capacitor embodying the present invention. Firstly, a thick silicon oxide 40a is selectively grown on a silicon substrate 40b. A gate oxide layer (not shown) is grown on a major surface of the silicon substrate 40b, and a polysilicon layer (not shown) is laminated on the silicon oxide layer. The polysilicon layer is patterned into a gate electrode (not shown) by using the lithographic techniques and the dry etching, and side wall spacers (not shown ) are formed on both side surfaces of the gate electrode. While a silicon oxide layer is formed into the side wall spacers, the gate oxide layer is removed from the major surface of the silicon substrate exposed to the etchant. A gate oxide layer and word lines for other memory cells are seen in the figures, and are labeled with references 41a and 41b, respectively. A part of the word line 41b serves as a gate electrode for another switching transistor of the other memory cell.

Using the gate electrode and the side wall spacers as an etching mask, dopant impurity is ion implanted into the silicon substrate 40b, and a source region 41c and a drain region (not shown) are formed in the silicon substrate 40b. Thus, a switching transistor is firstly formed on the silicon substrate 40b.

Figure 7A:
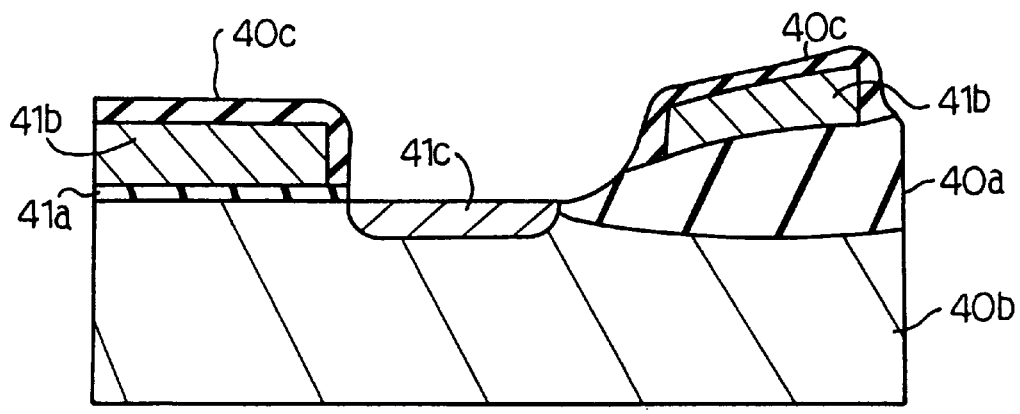
FIGS. 7A to 7E are cross sectional views showing another process of fabricating a stacked storage capacitor according to the present invention.

Silicon oxide is formed over the surfaces of the word lines 41b and, accordingly, the gate electrodes so as to cover them with a silicon oxide layer 40c as shown in FIG. 7A.

Figure 7B:
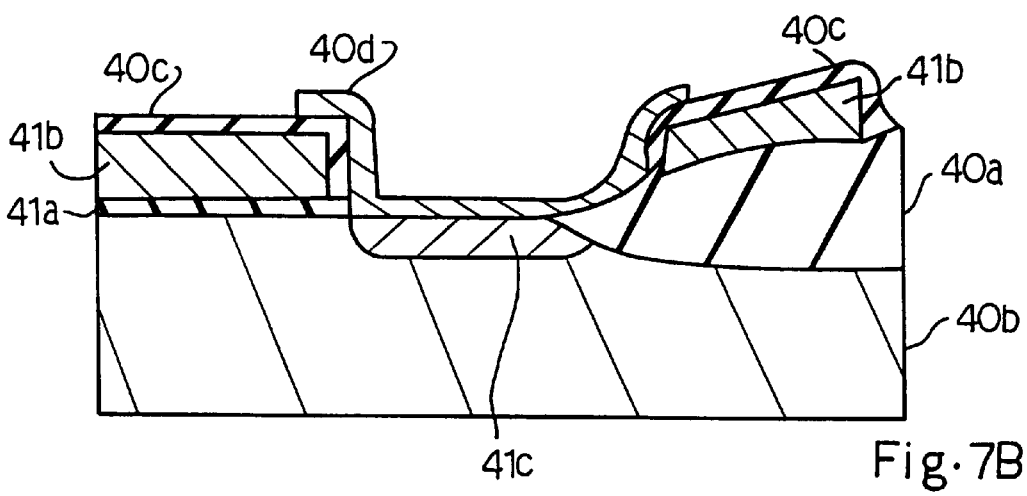

Titanium nitride is deposited to 30 nanometers to 600 nanometers thick over the entire surface of the resultant semiconductor structure by using a sputtering or a chemical vapor deposition, and the titanium nitride layer is patterned into a titanium nitride strip 40d by using the lithographic techniques and the dry etching. The titanium nitride strip 40d covers at least the source region 41c as shown in FIG. 7B. The titanium nitride strip 40d may be increased in dense by using a lamp annealing in nitrogen ambience or ammonia ambience at 600 degrees to 900 degrees in centigrade. Alternatively, titanium is deposited by using a sputtering or a chemical vapor deposition, and the titanium layer may be lamp annealed in the nitrogen ambience or the ammonia ambience at 600 degrees to 900 degrees in centigrade so as to nitride the titanium layer.

Figure 7C:
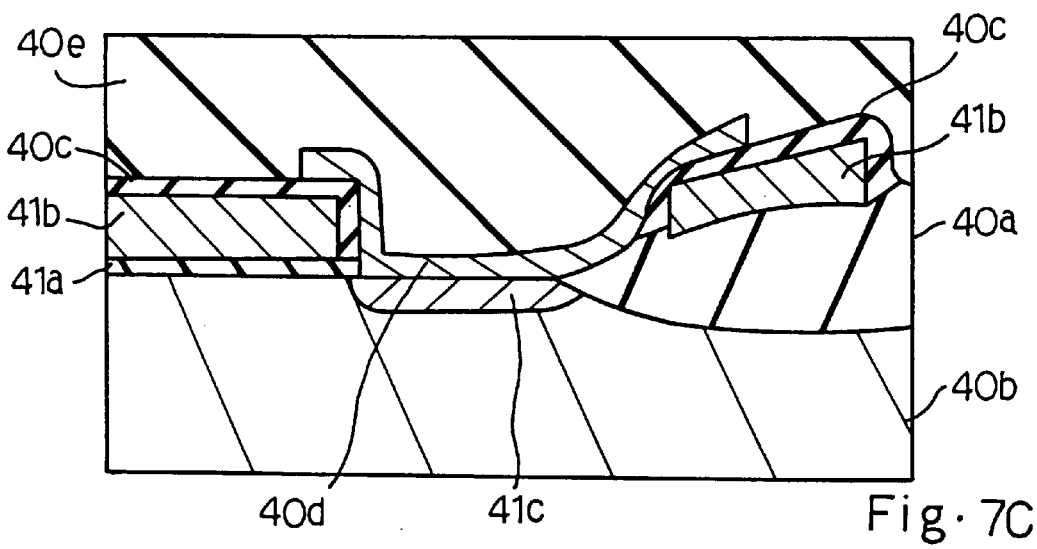

Subsequently, silicon oxide is deposited to 300 nanometers to 800 nanometers thick over the entire surface of the resultant semiconductor structure by using a chemical vapor deposition, and the silicon oxide layer 40c and the titanium nitride strip 40d are covered with a silicon oxide layer 40e as shown in FIG. 7C.

Figure 7D:
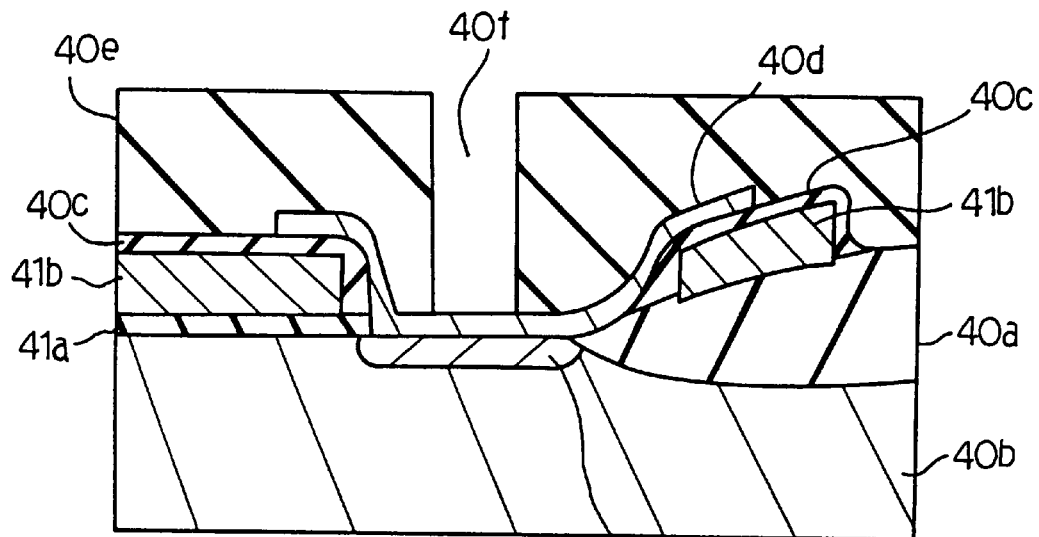

A contact hole 40f is formed in the silicon oxide layer 40e by using the lithographic techniques and the dry etching, and the titanium nitride strip 40d is exposed to the contact hole as shown in FIG. 7D.

Subsequently, as similar to the first embodiment, phosphorous-doped amorphous silicon layer is deposited over the entire surface of the resultant semiconductor structure by using a low-pressure chemical vapor deposition, and the phosphorous-doped amorphous silicon layer is 200 nanometers to 500 nanometers thick. The phosphorous-doped amorphous silicon layer is patterned into a phosphorous-doped amorphous silicon strip by using the lithographic techniques and the dry etching. Hemi-spherical silicon grains 41e are grown on the phosphorous-doped amorphous silicon strip 41d as follows. $Si_2H_6$ gas is supplied to the reactor at 540 degrees to 650 degrees in centigrade at $10^{-3}$ torr or less for 1 minute to 2 minutes, and the flow rate of $Si_2H_6$ gas is regulated to 20 sccm to 30 sccm. Thereafter, the resultant semiconductor structure is maintained in the high-temperature ambience for 1 minute to 10 minutes so as to form an accumulating electrode 41f. The accumulating electrode 41f is twice as wide in the surface area as a standard accumulating electrode without the hemi-spherical silicon grains.

Subsequently, $SiH_2Cl_2$ gas and $NH_3$ gas are introduced into a reactor of a low-pressure chemical vapor deposition system, and silicon nitride is deposited to 5 nanometers to 10 nanometers thick. The accumulating electrode 41f is topographically covered with a silicon nitride layer, and a surface portion of the silicon nitride layer is thermally oxidized so as to laminate a silicon oxide layer. The remaining silicon nitride layer and the silicon oxide layer form in combination a composite dielectric film.

Figure 7E:
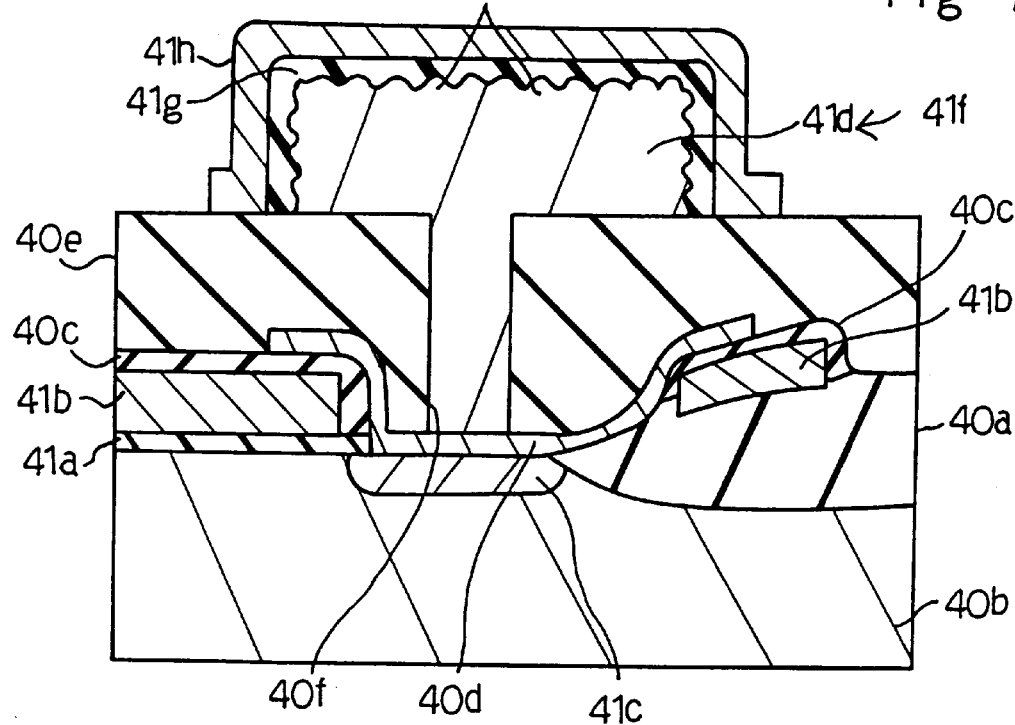

Polysilicon is deposited to 100 nanometers to 300 nanometers thick over the entire surface of the composite dielectric film by using a low-pressure chemical vapor deposition, and phosphorous is introduced into the polysilicon layer by using an ion-implantation or a thermal diffusion. Finally, the phosphorous-doped polysilicon layer and the composite dielectric film are patterned into a dielectric layer 41g and a counter electrode 41h by using the lithographic techniques and the dry etching. The resultant semiconductor structure is shown in FIG. 7E.

The third embodiment achieves all the advantages of the first embodiment. Although the titanium nitride strip 40d is patterned from the titanium nitride layer, the deposition of the titanium nitride is not expected to form a good coverage. The manufacturer would select the first embodiment or the third embodiment depending upon the constitution of the fabrication line. The titanium nitride layer 40d extends on the insulating layer 40c and the field oxide layer 40a, and allows the manufacturer to mis-align the contact hole 40f with the impurity region 41c, because the conductive titanium nitride layer connects the accumulating electrode 41d to the impurity region 41c.

Although particular embodiments of the present invention have been shown and described, it will be obvious to those skilled in the art that various changes and modifications may be made without departing from the spirit and scope of the present invention.

The present invention is applicable to any capacitor incorporated in an ultra large scale integration, and is never restricted to a dynamic random access memory cell.

The dynamic random access memory cell may be formed in a well opposite in conductivity type to the source and drain regions of the switching transistor.

Any conductive material is available for the barrier layer in so far as it blocks the semiconductor substrate or the impurity region from dopant impurity introduced into the accumulating electrode. Examples of such a conductive material is tungsten nitride and tantalum nitride.

The composite dielectric film structure may be formed from a silicon nitride layer, a silicon oxide layer and a silicon nitride layer.

Phosphorous-doped polysilicon may be deposited over the barrier layer so as to form phosphorous-doped polysilicon plug from the phosphorous-doped polysilicon layer. In this instance, the phosphorous-doped amorphous silicon is deposited over the phosphorous-doped polysilicon plug, and the hemi-spherical silicon grains are grown on the phosphorous-doped amorphous silicon strip.

Non-doped amorphous silicon may be deposited. In this instance, phosphorous is ion implanted into the non-doped amorphous silicon before the growth of the hemi-spherical silicon grains.

If the contact hole 31b/40f has a large aspect ratio, the deposition of non-doped amorphous silicon and an ion-implantation of phosphorous are repeated so as to fill the contact hole therewith.

The hemi-spherical silicon grains may be grown on a non-doped amorphous silicon strip. In this instance, phosphorous is ion implanted after the growth of the hemi-spherical silicon grains.

The dopant impurity is not limited to phosphorous. Another dopant impurity such as, for example, arsenic may be introduced into the amorphous silicon.

Finally, any conductive material is available for the barrier layer in so far as it blocks a semiconductor substrate from a dopant impurity introduced into an accumulating electrode.

What is claimed is:

1. A process of fabricating a capacitor on a semiconductor substrate, comprising the steps of:
   a) preparing a semiconductor substrate having a contact area;
   b) forming a barrier layer covering said contact area and formed of a conductive material blocking said contact area from a dopant impurity;
   c) forming a boss portion of an accumulating electrode formed of semiconductor material doped with said dopant impurity and held in contact with said barrier layer;
   d) growing a rough surface portion of said accumulating electrode on said boss portion by using a high-temperature growing technique;
   e) covering said rough surface portion with a dielectric layer; and
   f) forming a counter electrode on said dielectric layer.

2. The process as set forth in claim 1, in which said step a) includes the sub-steps of
   a-1) depositing a kind of insulating material over a major surface of said semiconductor substrate so as to cover the major surface with an inter-level insulating layer, and
   a-2) forming a contact hole in said inter-level insulating layer so as to expose said contact area thereto, said step b) including the sub-steps of b-1) depositing a kind of refractory metal over the entire surface of the resultant structure of said step a-2) so that a refractory metal layer topographically extends over an upper surface of said inter-level insulating layer, an inner surface of said inter-level insulating layer exposed to said contact hole and said contact area, b-2) heating said refractory metal layer in a nitriding ambience so as to convert a part of said refractory metal layer on said contact area and a remaining part of said refractory metal layer on said upper surface and said inner surface to a refractory metal silicide layer and a refractory metal nitride layer, respectively, and b-3) removing said refractory metal nitride layer so as to leave said refractory metal silicide layer on said contact area as said barrier layer.

3. The process as set forth in claim 2, in which said kind of refractory metal is titanium.

4. The process as set forth in claim 2, in which said nitriding ambience contains gas selected from the group consisting of nitrogen and ammonia.

5. The process as set forth in claim 2, in which said refractory metal nitride layer is etched by using one of first etching solution containing ammonia and hydrogen peroxide and second etching solution containing sulfuric acid and hydrogen peroxide.

6. The process as set forth in claim 1, in which said step a) includes the sub-steps of a-1) depositing a kind of insulating material over a major surface of said semiconductor substrate so as to cover the major surface with an inter-level insulating layer, and a-2) forming a contact hole in said inter-level insulating layer so as to expose said contact area thereto, said step b) including the sub-steps of b-1) depositing a kind of refractory metal nitride so as to fill said contact hole therewith and swell into a refractory metal nitride layer extending over an upper surface of said inter-level insulating layer, and b-2) etching said refractory metal nitride layer so as to leave a piece of said kind of refractory metal nitride in said contact hole, said piece of said kind of refractory metal nitride serving as said barrier layer.

7. The process as set forth in claim 6, in which said step b) further includes the sub-step of b-3) annealing said piece of said kind of refractory metal nitride in certain atmosphere containing at least one of nitrogen and ammonia.

8. The process as set forth in claim 6, in which one of tetrakis-dimethylamino-titanium and tetrakis-diethylamino-titanium is pyrolyzed so as to deposit said kind of refractory metal nitride in said step b-1).

9. The process as set forth in claim 6, in which said kind of refractory metal nitride is produced from gaseous mixture containing $TiCl_4$ and $NH_3$ in said step b-1).

10. The process as set forth in claim 1, in which said step a) includes the sub-steps of a-1) fabricating a field effect transistor having source and drain regions and a gate electrode on said semiconductor substrate, one of said source and drain regions serving as said contact area, and a-2) covering said gate electrode with a first insulating layer, said step b) including the sub-steps of b-3) depositing a kind of refractory metal nitride so that a refractory metal nitride layer extends over said one of said source and drain regions and said first insulating layer, b-2) patterning said refractory metal nitride layer into a refractory metal nitride strip covering at least said one of said source and drain regions, b-3) depositing a kind of insulating material so as to cover the resultant structure of said sub-step b-2) with a second insulating layer, and b-4) forming a contact hole in said second insulating layer so as to expose said one of said source and drain regions thereto.

11. The process as set forth in claim 10, in which said refractory metal nitride layer is deposited by using one of a sputtering and a chemical vapor deposition.

12. The process as set forth in claim 1, in which said step a) includes the sub-steps of a-1) fabricating a field effect transistor having source and drain regions and a gate electrode on said semiconductor substrate, one of said source and drain regions serving as said contact area, and a-2) covering said gate electrode with a first insulating layer, said step b) including the sub-steps of b-1) depositing a kind of refractory metal so that a refractory metal layer extends over said one of said source and drain regions and said first insulating layer, b-2) heating said refractory metal layer in nitriding ambience so as to produce a refractory metal nitride layer from said refractory metal layer, b-3) patterning said refractory metal nitride layer into a refractory metal nitride strip covering at least said one of said source and drain regions, b-4) depositing a kind of insulating material so as to cover the resultant structure of said sub-step b-2) with a second insulating layer, and b-5) forming a contact hole in said second insulating layer so as to expose said one of said source and drain regions thereto.

13. The process as set forth in claim 1, in which said step d) includes the sub-steps of d-1) supplying a kind of material gas containing $Si_2H_6$ at 20 sccm to 30 sccm for 1 minute to 2 minutes to a low pressure high-temperature reactor chamber at $10^{-3}$ torr or less where the resultant structure of said step c) is heated to 540 degrees to 650 degrees in centigrade, and d-2) growing hemi-spherical silicon grains serving as said rough surface portion on said boss portion in said low-pressure high-temperature reactor chamber for 1 minute to 10 minutes.

14. The process as set forth in claim 13, in which said hemi-spherical silicon grains are grown on said boss portion formed of amorphous silicon doped with said dopant impurity.

* * * * *